United States Patent [19]

Rickert

[11] Patent Number: 4,808,431
[45] Date of Patent: Feb. 28, 1989

[54] METHOD FOR CONTROLLING PLATING ON SEEDED SURFACES

[75] Inventor: Robert G. Rickert, Endwell, N.Y.

[73] Assignee: International Business Machines Corp., Armonk, N.Y.

[21] Appl. No.: 130,590

[22] Filed: Dec. 8, 1987

[51] Int. Cl.$^4$ .............................................. B05D 1/18
[52] U.S. Cl. ........................................ 427/8; 427/10; 427/443.1
[58] Field of Search .................... 427/8, 443.1, 10

[56] References Cited

U.S. PATENT DOCUMENTS

| | | | |
|---|---|---|---|
| 4,152,467 | 5/1979 | Alpaugh | 427/8 |
| 4,554,184 | 11/1985 | Canestaro | 427/443.1 |
| 4,623,554 | 11/1986 | Kaschak | 427/8 |
| 4,626,446 | 12/1986 | Capwell | 427/443.1 |
| 4,654,126 | 3/1987 | Amelio | 427/8 |
| 4,684,545 | 8/1987 | Fey | 427/443.1 |
| 4,692,346 | 9/1987 | McBride | 427/8 |
| 4,707,377 | 11/1987 | Capwell | 427/8 |
| 4,707,378 | 11/1987 | McBride | 427/8 |

Primary Examiner—Shrive Beck
Assistant Examiner—Vi Duong Dang
Attorney, Agent, or Firm—Pollock, Vande Sande & Priddy

[57] ABSTRACT

A method for preparing and maintaining an electroless plating bath. Seeded surfaces include a palladium and tin coating which receives plating from an electroless plating bath. The plating bath conditions are maintained by measuring the open circuit potential of the bath with a potentiostat. The chemical constituent concentration levels are adjusted to a first open circuit potential for the bath. Air is removed from the bath and the open circuit potential increases to a second level representing a bath chemical activity which produces optimum electroless plating on the seeded surfaces. Parts having seeded surfaces are inserted in the bath and a flow of air is re-established in the bath, rendering less negative the open circuit voltage potential during plating of the parts.

8 Claims, 3 Drawing Sheets

METHOD FOR CONTROLLING PLATING ON SEEDED SURFACES

The present invention relates to the control of electroless plating bath chemistry. Specifically, a method for controlling the chemical activity level in an electroless plating bath to avoid the formation of nodules on a seeded surface is described.

The manufacture of printed circuit boards in an additive electroless plating process requires several processing steps to prepare the epoxy substrates for copper plating. These steps include predrilling component lead holes in multilayer epoxy substrates which have been suitably masked with line work representing circuit traces. The masked and drilled substrates are immersed in a seed bath of palladium and tin which adheres to exposed unmasked portions of the epoxy substrate. The holes in the circuit board are also plated with the palladium and tin, forming a surface to which electroless plated copper adheres.

The subsequent copper plating must be a continuous plated surface free from voids or nodules which reduce the resulting circuit reliability. Nodules form on the copper plating surfaces when the electroless plating bath chemical activity increases beyond a certain range. The nodules can result in unintentional bridges between circuit traces on the printed circuit board. A chemically underactive bath can produce copper plating which has voids and a non-uniform thickness decreasing circuit trace reliability. Subsequent processing steps generate moisture providing short circuit conditions in the area of the copper voids. At present, the bath chemistry is adjusted manually with the operator making periodic adjustments to chemical set points. These periodic adjustments are sometimes extreme so that either an overactive or underactive chemical bath results.

SUMMARY OF THE INVENTION

It is an object of this invention to control the chemical activity of an electroless plating bath.

It is a more specific object of this invention to plate seeded circuit boards in an electroless plating bath at a uniform thickness.

These and other objects of the invention are achieved by monitoring the electrical potential Emix of a copper substrate vs. a reference electrode disposed in an electroless plating path. Using a potentiostat with a working electrode, counter electrode and reference electrode immersed in an electroless plating bath, the electrical potential Emix for the bath may be continuously monitored.

The bath is initialized by controlling the concentration of the formaldehyde to achieve a desired plating rate on a test copper coupon inserted in the bath. Next, the Emix potential is set by adjusting one or more of the bath chemical constituents. Once the bath Emix potential is at a minimum level, the supply of air to the bath is turned off. The parts to be plated are then loaded in the bath and the air is turned on again for a brief predetermined interval.

The turning off of the air will result in the bath chemical activity increasing to a level which is ideal for plating. Resumption of the air supply will suppress the chemical activity, thereby avoiding an overactive bath chemistry which is likely to produce nodules on the seeded surfaces.

DESCRIPTION OF THE PREFERRED EMBODIMENT

Figure 1:
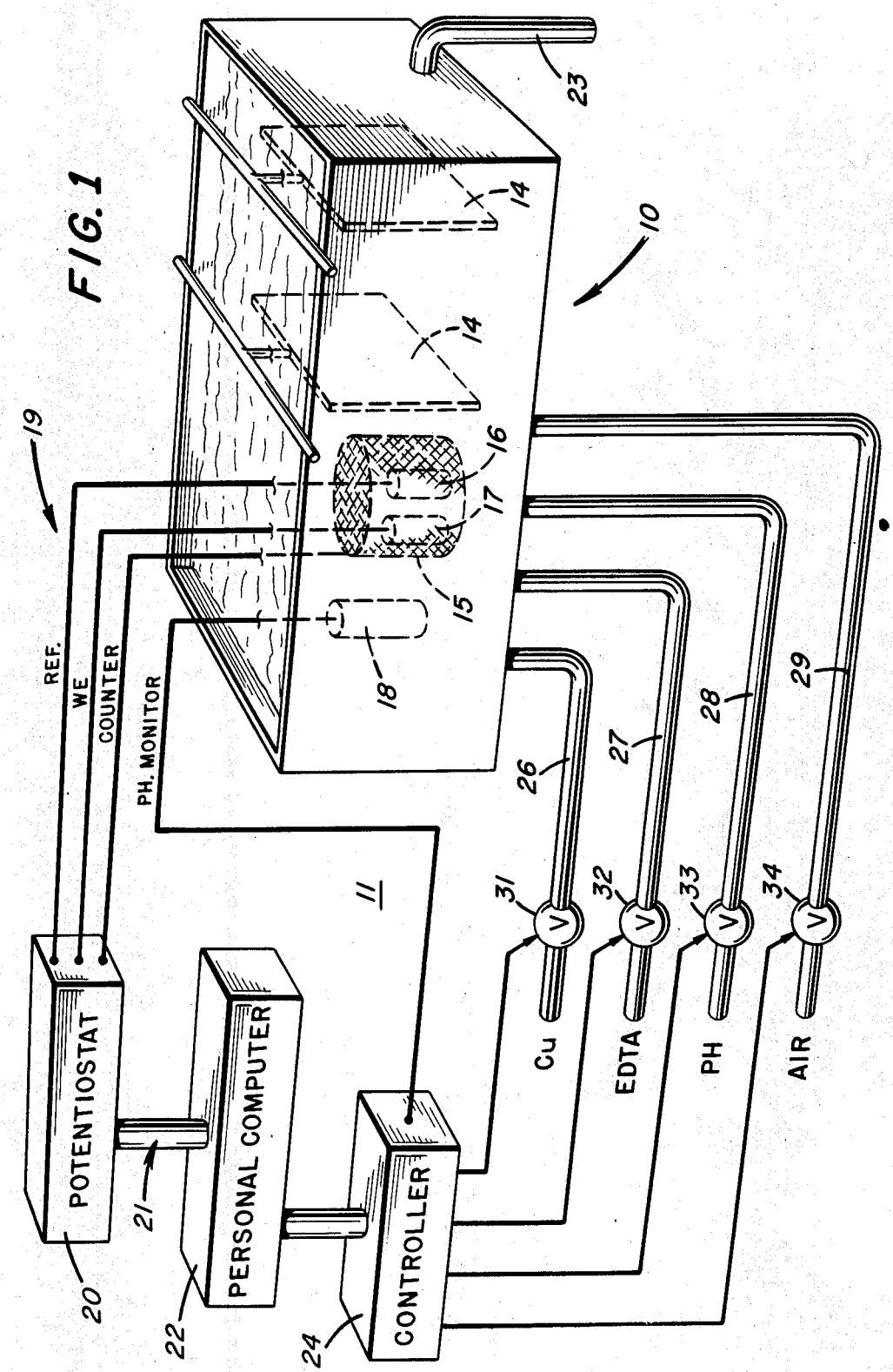
FIG. 1 is a schematic drawing of a system for electroless plating seeding circuit substrates.

Referring now to FIG. 1, there is shown an electroless plating bath 10 with a controller 24 hereinafter further described for maintaining a desired bath chemistry. Parts 14 which include an epoxy substrate, seeded with a palladium and tin coating, are suspended in the electroless plating bath.

Monitoring bath chmistry is obtained by the use of a potentiostat 20 such as the EG&G Model 120, which is connected by a cable 19 to three electrodes 15, 16 and 17 immersed in the electroless plating bath 10. pH monitoring probe 18 is connected to controller 24. The electrodes include a reference electrode 16 which is either a saturated calomel or silver/silver chloride electrode. A copper working electrode 17 and counter electrode 15 are provided to make electric potential measurements which determine the bath chemical activity.

The bath 10 is set at an initial chemical composition which approximates the following concentration levels:

CuSo4: 5–15 grams/liter
HCHO: 1–6 grams/liter
EDTA: 25–50 grams/liter
NaCn: 5–35 ppm The bath physical conditions are initially set to the following conditions:

temperature: 60°–80° C.
specific gravity: 1.06–1.09
wetting agent: 10–100 ppm
pH: 11–13

Prior to plating any parts 14, the plating rate of the bath 10 is established by any one of known techniques. This may be determined by inserting a test coupon not shown in the bath and measuring the amount of copper deposited thereon. Alternatively, techniques such as is described in U.S. Pat. No. 4,623,554, hereby incorporated by reference, may be used to set an initial plating rate for the bath.

The pH level of the bath 10 is established by adding sufficient levels of NaOH to the bath. Control over the specific gravity is effected by adding water to the bath 10. Overflow from the bath 10 can be drained by means of a suitable pipe 23.

Having once established the initial conditions for the plating bath 10, monitoring and control over the bath chemical activity may begin. The potentiostat 20 is capable of measuring an open circuit potential between the reference electrode 16 and working electrode 17 to derive an indication of the bath chemical activity. Cable 21 interconnects the potentiostat over a standard interface to personal computer 22. The personal computer 22 is also connected to the controller 24, which is an analog interface for controlling a plurality of valves associated with a supply of each chemical constituent of the bath 10.

The Emix potential which is the open circuit potential of a copper substrate versus a reference electrode, is a function of the concentration of individual bath constituents as follows:

$$\text{Emix}_{(mv)} = -159084 + 10294\,[\text{HCHO}] - 70484\,[\text{Cu}] + 10233\,[\text{pH}] + 9352\,[\text{EDTA}]$$

Experimental determinations have been made regarding the desired level of Emix versus "take" conditions, i.e., the conditions in which seeded plating surfaces are plated without voids or nodules. The Emix level which appears to produce exceptional plating of copper for the foregoing bath is approximately $-660$ mv. Emix levels lower than $-680$ mv form nodules. Voids occur when Emix potentials are $-580$ mv or higher. Control over the bath chemistry within these boundaries is desirable.

Another indication of when the optimum "take" conditions exist in the bath 10, relates to current measurements between electrodes. The potential between the reference electrode 16 and working electrode 17 is continuously monitored. It has been determined experimentally that the optimum "take" conditions for the bath 10 occur when the current is applied to the working electrode 17, such that its potential with respect to the reference electrode 16 is $-200$ mv. Current is then applied to the working electrode 17 such that the potential with respect to the reference electrode 16 is $-300$ mv. When the current at $-200$ mv is greater than the current at $-300$ mv: $I_{300} < I_{200}$, the condition is reached.

Figure 2:
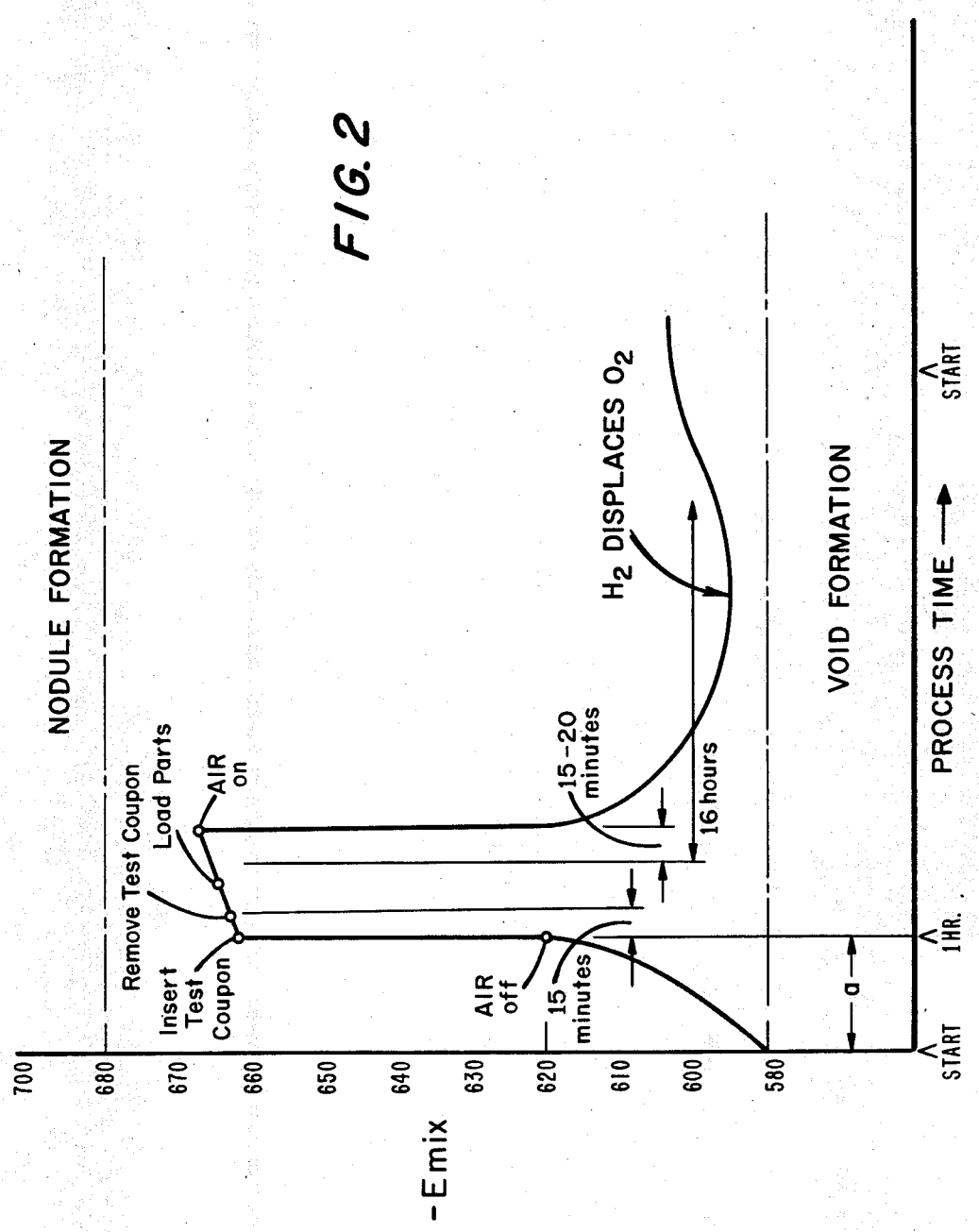
FIG. 2 is an illustration of the change in Emix potential for the electroless plating bath prior to and during plating of seeded parts.

The process for establishing a plating bath for seeded parts is shown in FIG. 2. The initial chemistry adjustments are shown in the region (a). Having reached a threshold open circuit $-$Emix potential of 620–630 mv, the air is turned off. The $-$Emix potential rises very rapidly near 660 mv in approximately 5 minutes time. A test coupon, not shown, is inserted in the bath for approximately 15 minutes. The test coupon, seeded with palladium and tin, should evidence good plating without voids, verifying that the bath is in condition to plate the parts which have been previously seeded with palladium and tin.

The seeded parts are loaded in the bath and the air is turned back on after an additional 15-20 minute delay. The chemical activity of the bath decreases, thereby lowering Emix. During plating, which occurs over a period of 16 hours, the parts will release hydrogen into the bath which displaces the oxygen being added by the air supply. $-$Emix will generally become more negative as shown. The voltage potential change in Emix will not adversely effect the plating quality as the initial deposition was made under a sufficiently higher chemical activity, but not high enough to produce nodules on the plated surface.

The foregoing method may be implemented by programming the computer 22 to initialize the bath 10 to obtain a desired Emix. The potentiostat 20, computer 22 and interface 24 form a closed loop system during intialization of the bath. Valves 31, 32, 33 and 34 will be operated incrementally according to the flow chart of FIG. 3.

Figure 3:
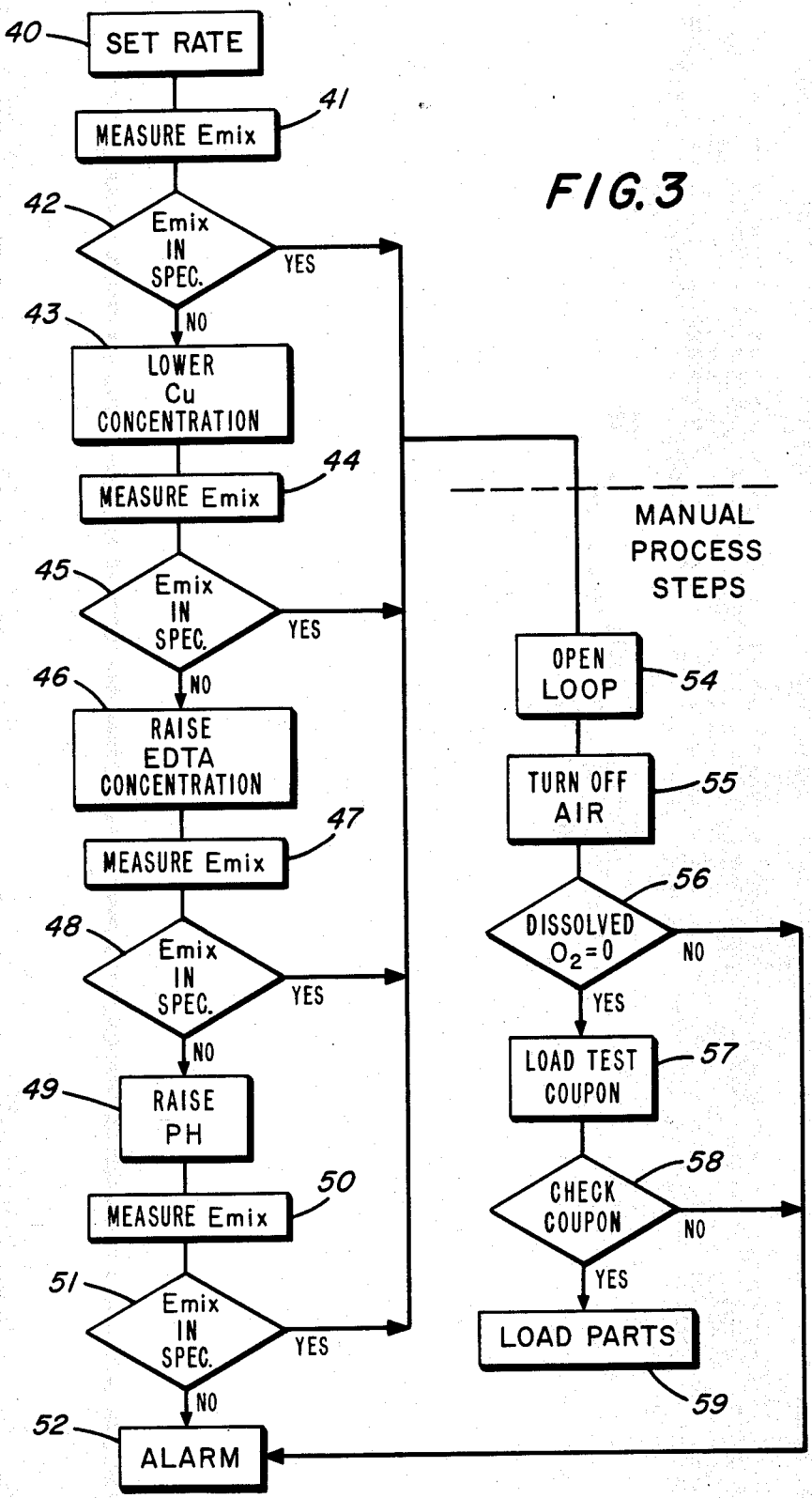
FIG. 3 is a flow chart illustrating the control over the electroless plating bath of FIG. 1.

Referring now to FIG. 3, the programming steps are shown for computer 22, in their order of execution, for maintaining the bath chemistry for an optimum plating condition as shown in FIG. 2. The first step of the process requires setting a plating rate in an open loop. This is effected by first setting the rate of formaldehyde (HCHO) introduction such that it produces a desired plating rate of 0.05-0.2 mils per hour. Once the plating rate is set in step 40, the copper, EDTA, and pH are adjusted in the order shown to derive the correct Emix potential of 620–630 mv. The Emix potential is checked in steps 41, 44, 47 and 50. If the desired Emix is not obtained as measured by the potentiostat 20 connected to the working and reference electrodes 17 and 16, each of the concentrations is changed sequentially in steps 43, 46 and 49 until the desired Emix is obtained. The concentration levels are changed in increments which produce a 10 mv change in Emix. Using the foregoing Emix equation, it is possible to derive a set of tables which identify the changes in concentration level necessary to produce a given change in Emix potential. In the event that the incremental changes in bath chemistry which are effected do not bring the bath Emix potential to the desired level, step 51, an alarm is posted on the screen of computer 22, step 52.

The system enters an open loop condition and the air is shut off in step 54 when the desired Emix is reached. The remaining steps are executed manually with the bath chemistry remaining as previously fixed.

The dissolved oxygen in the bath is tested manually in step 56 by the system operator. When the level of the dissolved oxygen is zero, a test coupon is inserted in the bath for approximately 5 minutes, step 57. If dissolved oxygen does not reach zero, an alarm, step 52, is activated, indicating malfunction. If the seeded coupon plates without voids, as determined in step 58, the bath is considered to be ready to accept parts for plating. Likewise, an alarm is activated, step 52, if the test coupon fails to plate. The parts are loaded manually into the bath in step 59 and plating commences for approximately 15 to 20 minutes before air is turned on. The parts remain in the bath for 16 hours before removal.

Thus, there is described a method which provides electroless plating of seeded parts without risking the formation of nodules or plating voids. The electroless bath may be conditioned to begin the plating process without extensive trial and error procedures.

Having thus described our invention, what we claim as new, and desire to secure by Letters patent is:

1. A method for preparing an electroless plating bath for plating parts having a seeded surface, said bath comprising a plurality of chemical constituents, including air, which are controlled to achieve a desired plating condition comprising:

measuring the open circuit potential of said bath Emix;

adjusting some of said bath chemical constituent concentration levels within a predetermined range until a first Emix potential between a working electrode and a reference electrode immersion in said bath is reached;

removing air from said bath, whereby said bath open circuit Emix potential reaches a second Emix below an Emix level which produces undesirable nodules on parts in said bath;

inserting seeded parts to be plated in said bath;

re-establishing a flow of air in said bath, whereby said Emix potential decreases during plating of said parts.

2. The method of claim 1 wherein a test coupon is inserted in said bath to verify the plating qualities of said bath prior to inserting said parts.

3. The method of claim 1 further comprising:

generating a flow of current between a reference electrode and said working electrode immersed in said bath;

measuring the potential of said working electrode with respect to said reference electrode for first and second current levels.

4. The method of claim 3 wherein said precise time occurs when said currents are equal and said measured potentials are −200 mv and −300 mv.

5. In an electroless copper plating bath which plates copper onto a seeded surface, said bath including formaldehyde, copper sulfate, EDTA and a supply of air, a method for controlling bath chemistry to avoid the plating of nodules on said seeded surface comprising:
  adjusting the formaldehyde concentration to obtain a predetermined plating rate in said bath;
  measuring the voltage between a pair of immersed electrodes to determine an open circuit potential Emix;
  adjusting the remaining of said bath constituents to obtain a first potential Emix;
  inhibiting said supply of air when said first potential Emix is reached, whereby said bath chemical activity increases to a level sufficient to produce plating on a seeded part but insufficient to generate copper nodules on said seeded part; and
  re-enabling said supply of air after said seeded surfaces have been inserted in said bath, whereby said bath chemistry becomes less active during plating of said seeded surfaces.

6. The method of claim 5 further comprising waiting a period of time after inserting said seeded surfaces into said bath before re-enabling said supply of air.

7. The method of claim 6 wherein said period of time is within the range of 15 to 20 minutes.

8. The method of claim 5 further comprising a test coupon in said bath to determine whether said bath is ready to accept said seeded surfaces.

* * * * *